US008359448B1

(12) United States Patent
Neuendorffer (10) Patent No.: US 8,359,448 B1
(45) Date of Patent: Jan. 22, 2013

(54) SPECIFIC MEMORY CONTROLLER IMPLEMENTED USING RECONFIGURATION

(75) Inventor: Stephen A. Neuendorffer, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 837 days.

(21) Appl. No.: 12/505,380

(22) Filed: Jul. 17, 2009

(51) Int. Cl.
*G06F 12/02* (2006.01)

(52) U.S. Cl. .......... 711/170; 326/39; 711/171; 711/173; 716/116

(58) Field of Classification Search .......... 711/170, 711/171, 173; 716/116; 326/39
See application file for complete search history.

(56) References Cited

U.S. PATENT DOCUMENTS

| | | | | |
|---|---|---|---|---|
| 5,764,954 A | * | 6/1998 | Fuller et al. | 716/121 |
| 6,191,613 B1 | * | 2/2001 | Schultz et al. | 326/39 |
| 6,941,433 B1 | * | 9/2005 | Libby et al. | 711/167 |
| 7,512,762 B2 | * | 3/2009 | Gower et al. | 711/167 |
| 2002/0072893 A1 | * | 6/2002 | Wilson | 703/26 |
| 2004/0117557 A1 | * | 6/2004 | Paulraj et al. | 711/137 |

* cited by examiner

*Primary Examiner* — Jae Yu
(74) *Attorney, Agent, or Firm* — LeRoy D. Maunu (57) ABSTRACT

A circuit controls a memory arrangement and includes an array of programmable resources and interconnect resources, a reconfiguration port, and a processor. The programmable resources and interconnect resources in the array are initially configured with a reference configuration data-set. The reference configuration data-set configures the programmable resources and interconnect resources to implement a general memory controller. The processor obtains a characteristic of the memory arrangement and selects a particular partial reconfiguration data-set based on the characteristic of the memory arrangement. The processor reconfigures the programmable resources and interconnect resources in the array via the reconfiguration port. The processor reconfigures the programmable resources and interconnect resources with the particular partial reconfiguration data-set. The particular partial reconfiguration data-set partially reconfigures the programmable resources and interconnect resources to implement a portion of a specific memory controller that differs from the general memory controller.

20 Claims, 4 Drawing Sheets

SPECIFIC MEMORY CONTROLLER IMPLEMENTED USING RECONFIGURATION

FIELD OF THE INVENTION

The present invention generally relates to memory controllers, and more particularly to reconfigurable memory controllers.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The configuration data programs the FPGA to implement a wide variety of possible functions. The configuration data can be customized to implement a specific function in the FPGA. The configuration data for a specific function can be optimized to limit the propagation delays along the critical timing paths and consequently achieve high performance. For certain applications, it is desirable to implement a specific function that is programmable. However, programmability frequently increases the amount of logic along the critical timing paths, forcing a tradeoff between runtime programmability and system performance.

The present invention may address one or more of the above issues.

SUMMARY

Various embodiments of the invention provide a circuit for controlling a memory arrangement. The circuit includes an array of programmable logic and interconnect resources, a reconfiguration port, and a processor. The programmable logic and interconnect resources in the array are initially configured with a reference configuration data-set. The reference configuration data-set configures the programmable logic and interconnect resources to implement a general memory controller. The processor obtains a characteristic of the memory arrangement and selects a particular partial reconfiguration data-set based on the characteristic of the memory arrangement. The processor reconfigures the programmable logic and interconnect resources in the array via the reconfiguration port. The processor reconfigures the programmable logic and interconnect resources with the particular partial reconfiguration data-set. The particular partial reconfiguration data-set partially reconfigures the programmable logic and interconnect resources to implement a portion of a specific memory controller that differs from the general memory controller.

Various other embodiments of the invention provide a process for implementing a memory controller of a memory arrangement. A programmable integrated circuit includes an array of programmable logic and interconnect resources. A reference configuration data set is generated to configure the array to implement a general memory controller. Special configuration data-sets are generated for specific memory controllers. Each special configuration data set configures the array to implement a respective specific memory controller. The reference and special configuration data-sets match for a first portion of the array and the reference and special configuration data-sets do not match for a second portion of the array. Respective partial reconfiguration data-sets are generated for each special configuration data-sets. The respective partial reconfiguration data-set reconfigures the second portion of the array in accordance with the special configuration data-set. The respective partial reconfiguration data-set does not reconfigure the first portion of the array. The array of the programmable integrated circuit is configured with the reference configuration data-set. One of the specific memory controllers is selected based on a characteristic of the memory arrangement. The second portion of the array is reconfigured with the respective partial reconfiguration data-set for the special configuration data-set for the selected specific memory controller.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Various embodiments of the invention permit implementing various memory controllers without impacting the performance of those memory controllers, and without substantially increasing the space needed to store the configuration data for implementing the memory controllers.

Figure 1:
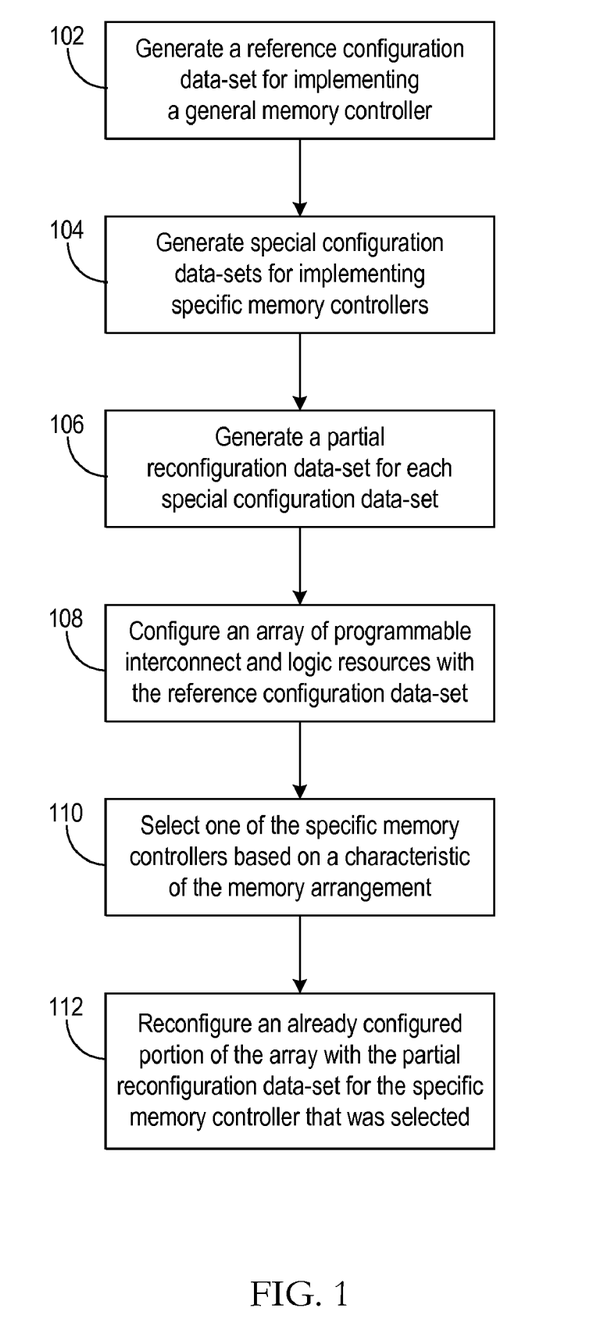
FIG. 1 is a flow diagram of a process for implementing a memory controller of a memory arrangement in accordance with an embodiment of the invention.

FIG. 1 is a flow diagram of a process for implementing a memory controller of a memory arrangement in accordance with various embodiments of the invention. In one embodiment, the process configures and reconfigures a programmable integrated circuit to implement the memory controller.

At step 102, a reference configuration data-set is generated for implementing a general memory controller. In one embodiment, synthesis tools generate the reference configuration data-set from a hardware description language (HDL) specification of the general memory controller. The reference configuration data-set configures a programmable integrated circuit to implement a general memory controller.

At step 104, special configuration data-sets are generated to implement specific memory controllers. In one embodiment, the HDL specification of the general memory controller is modified to create variants of the general memory controller, and synthesis tools generate a special configuration data-set from the modified HDL specification for each variant. Each special configuration data-set would configure the programmable integrated circuit to implement the corresponding specific memory controller. In this embodiment, the synthesis tools incrementally compile the modified HDL for each variant using the unmodified HDL as a reference, such that the special configuration data-set tends to match the reference configuration data-set for the portions of the specific memory controller that are unmodified portions of the general memory controller.

At step 106, a partial reconfiguration data-set is generated for each special configuration data-set. In one embodiment, a difference is determined between each special configuration data-set and the reference configuration data-set, and the partial reconfiguration data-set includes the differences between the special and reference configuration data-sets, but does not include some or all of the matching portions of these special and reference configuration data-sets. It will be appreciated that the partial reconfiguration data-sets can each reconfigure different portions of an array of programmable interconnect resources, and programmable resources such as programmable logic, for example.

At step 108, an array of programmable interconnect and logic resources is configured with the reference configuration data-set. Thus, the array of resources is configured to implement the general memory controller. In one embodiment, a programmable integrated circuit includes the array of programmable interconnect and logic resources.

At step 110, one of the specific memory controllers is selected based on a characteristic of the memory arrangement. An example characteristic is a latency of a column address strobe of one or more memory devices in the memory arrangement, and/or an arbitration protocol of a port of the specific memory controller for storing and retrieving data. The specific memory controller selected is the specific memory controller corresponding to the characteristic of the memory arrangement. In one embodiment, the characteristic is obtained from one or more memory devices in the memory arrangement and the corresponding specific memory controller is selected.

At step 112, the array of programmable interconnect and logic resources is reconfigured with the partial configuration data-set corresponding to the selected special memory controller. Because the array is first configured at step 108 with the reference configuration data-set and then reconfigured with a particular partial configuration data-set that implements the difference between the general and specific memory controllers, the array is reconfigured to implement the specific memory controller selected at step 110.

The process of FIG. 1 permits implementing many variants of a memory controller in a programmable integrated circuit. Each variant is implemented with custom configuration data, such that critical timing paths of the memory controller do not need extra logic to support the variants of the memory controller. Thus, multiple variants are supported without impacting system performance. In addition, the appropriate variant is selected based on a characteristic of an attached memory device in one embodiment, such that the same process can implement the appropriate memory controller for many possible attached memory devices, and do so without impacting system performance. Furthermore, the process does not need to store all of the configuration data for every possible variant; instead, the process stores the configuration data for a reference configuration data-set and smaller partial configuration data-sets for the variants.

Figure 2:
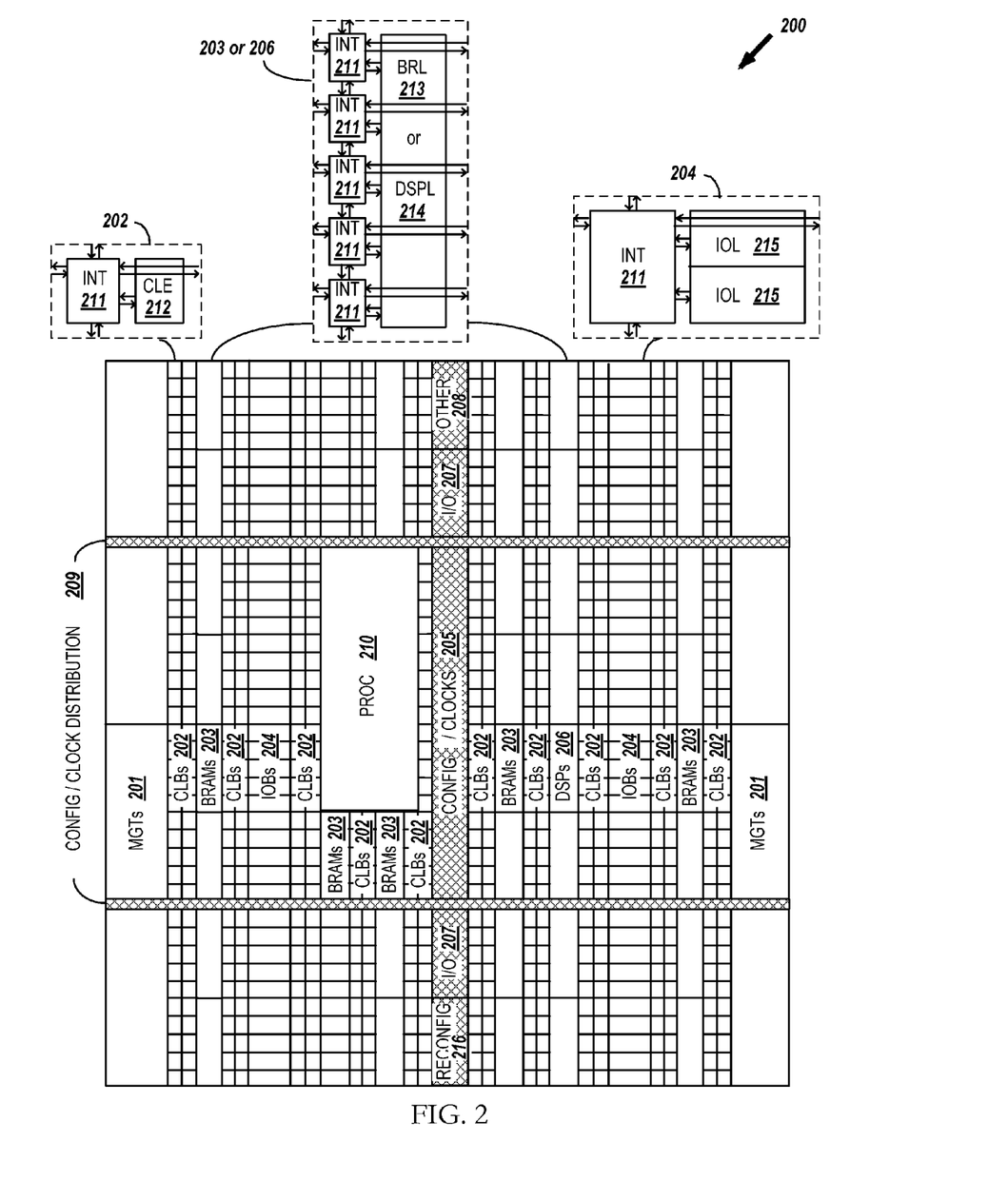
FIG. 2 is a block diagram of a programmable integrated circuit for implementing a memory controller in accordance with an embodiment of the invention.

FIG. 2 is a block diagram of an example programmable integrated circuit that may be used in implementing a memory controller in accordance with various embodiments of the invention. The programmable integrated circuit implements the memory controller after being configured with a reference configuration data-set and then reconfigured with a partial configuration data-set. As noted above, advanced FPGAs can include several different types of programmable logic blocks in the array. For example, FIG. 2 illustrates an FPGA architecture 200 that includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, a reconfiguration port (RECONFIG) 216, specialized input/output blocks (I/O) 207 (e.g., clock ports), and other programmable logic 208 such as digital clock managers, analog-to-digital converters, system monitoring logic, and so forth. Some FPGAs also include dedicated processor blocks (PROC) 210.

In some FPGAs, each programmable tile includes a programmable interconnect element (INT) 211 having standardized connections to and from a corresponding interconnect element in each adjacent tile. Therefore, the programmable interconnect elements taken together implement the programmable interconnect structure for the illustrated FPGA. The programmable interconnect element (INT) 211 also includes the connections to and from the programmable logic element within the same tile, as shown by the examples included at the top of FIG. 2.

For example, a CLB 202 can include a configurable logic element (CLE) 212 that can be programmed to implement user logic plus a single programmable interconnect element (INT) 211. A BRAM 203 can include a BRAM logic element (BRL) 213 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL) 214 in addition to an appropriate number of programmable interconnect elements. An IOB 204 can include, for example, two instances of an input/output logic element (IOL) 215 in addition to one instance of the programmable interconnect element (INT) 211. As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, in order to facilitate the efficient implementation of user logic.

Figure 3:
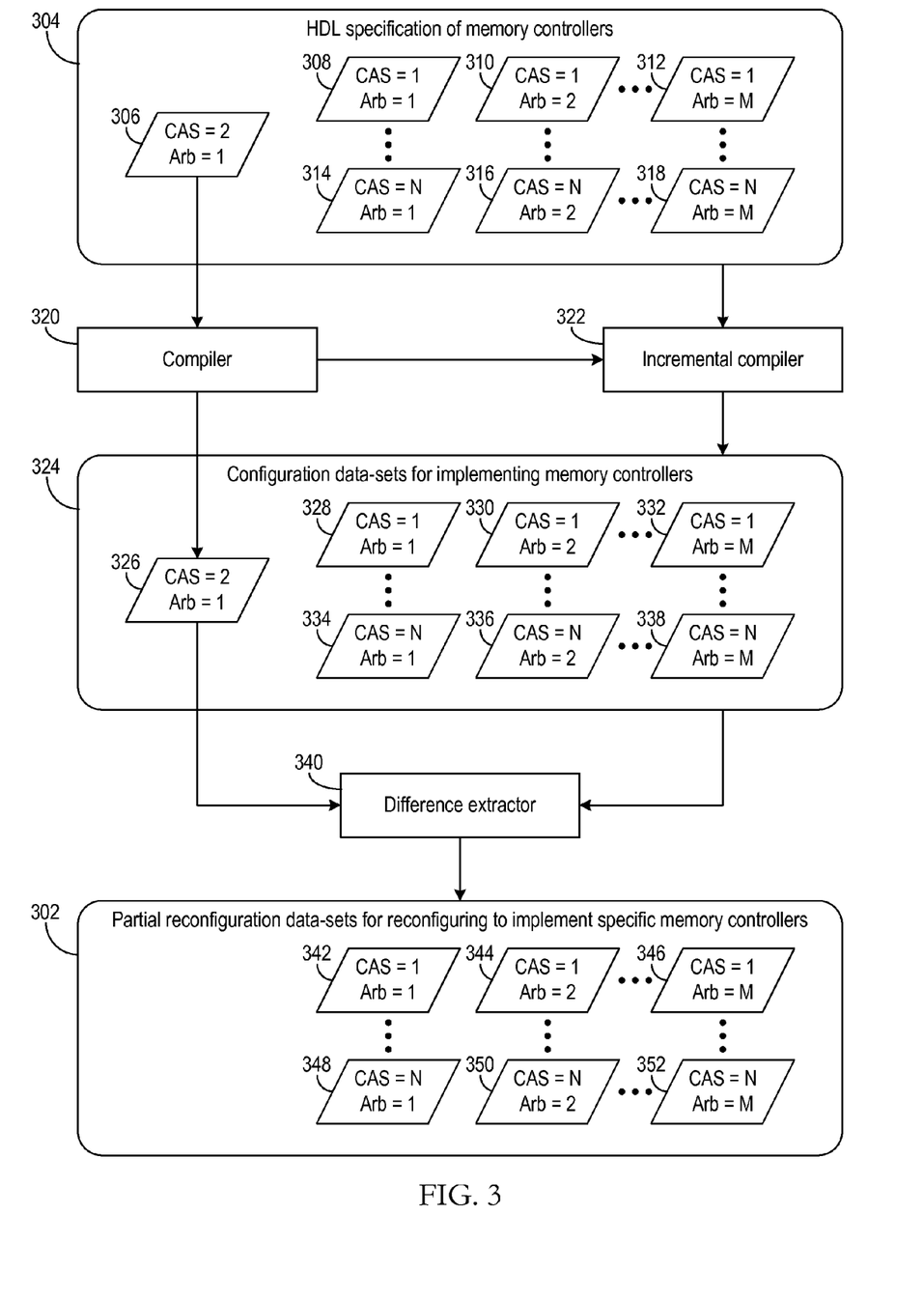
FIG. 3 is a dataflow diagram of a system for generating configuration data-sets for an example memory controller in accordance with an embodiment of the invention.

FIG. 3 is a dataflow diagram of a system for generating configuration data-sets for an example memory controller in accordance with various embodiments of the invention. The system generates partial reconfiguration data-sets 302 from hardware description language (HDL) specifications 304 of various memory controllers.

The HDL specifications 304 include the HDL specification 306 of a general memory controller that specifies default characteristics of the memory arrangement. Example characteristics include the required latency of column address strobe (CAS) of a memory device in the memory arrangement and an arbitration protocol or width of one or more ports for accessing data stored in the memory arrangement. For this example, the default characteristics of HDL specification 306 include a CAS latency of two and a first arbitration protocol of round-robin arbitration. In another example, the HDL specification of the general memory controller omits any logic blocks that might change between the various memory controllers. The HDL specifications 308, 310, 312, 314, 316, and 318 include various other possible combinations of the characteristics of the memory arrangement. In one embodiment, the HDL specifications 306 through 318 are a single data file modified with parameter values for the characteristics of the memory arrangement.

Compiler 320 and incremental compiler 322 generate the configuration data-sets 324 from the HDL specifications 304. Compiler 320 synthesizes reference configuration data-set 326 from the HDL specification 306 of the general memory controller. The reference configuration data-set 326 implements the general memory controller in a programmable integrated circuit. Compiler 320 also provides compilation information to incremental compiler 322. It will be appreciated that compiler 320 and incremental compiler 322 are different operating modes of the same synthesis tool in one embodiment of the invention.

Incremental compiler 322 synthesizes special configuration data-sets 328, 330, 332, 334, 336, and 338 from the HDL specifications 308, 310, 312, 314, 316, and 318, respectively. Each of the special configuration data-sets 328, 330, 332, 334, 336, and 338 implements a specific memory controller in the programmable integrated circuit.

Incremental compiler 322 uses information from compiler 320 to attempt to generate special configuration data-sets 328, 330, 332, 334, 336, and 338 having minimal differences from the reference configuration data-set 326. In one embodiment, incremental compiler 322 generates special configuration data-sets 328, 330, 332, 334, 336, and 338 that each match reference configuration data-set 326 except for configuration data values implementing the logic functions changed between HDL specification 306 and the respective HDL specifications 308, 310, 312, 314, 316, and 318.

Difference extractor 340 generates the partial reconfiguration data-sets 302 from the reference and special configuration data-sets 324. Difference extractor 340 generates partial reconfiguration data-set 342 from reference configuration data-set 326 and special configuration data-set 328. Partial reconfiguration data-set 342 includes the configuration data values that are different between reference configuration data-set 326 and special configuration data-set 328. In one embodiment, each configuration data value is not individually addressable in the programmable integrated circuit, and partial reconfiguration data-set 342 includes the configuration data values for each addressable unit that has different values in reference configuration data-set 326 and special configuration data-set 328. Thus, partial reconfiguration data-set 342 can include certain configuration data values that are the same in reference configuration data-set 326 and special configuration data-set 328. Partial reconfiguration data-sets 344, 346, 348, 350, and 352 are similarly generated from reference configuration data-set 326 and respective special configuration data-sets 330, 332, 334, 336, and 338.

Figure 4:
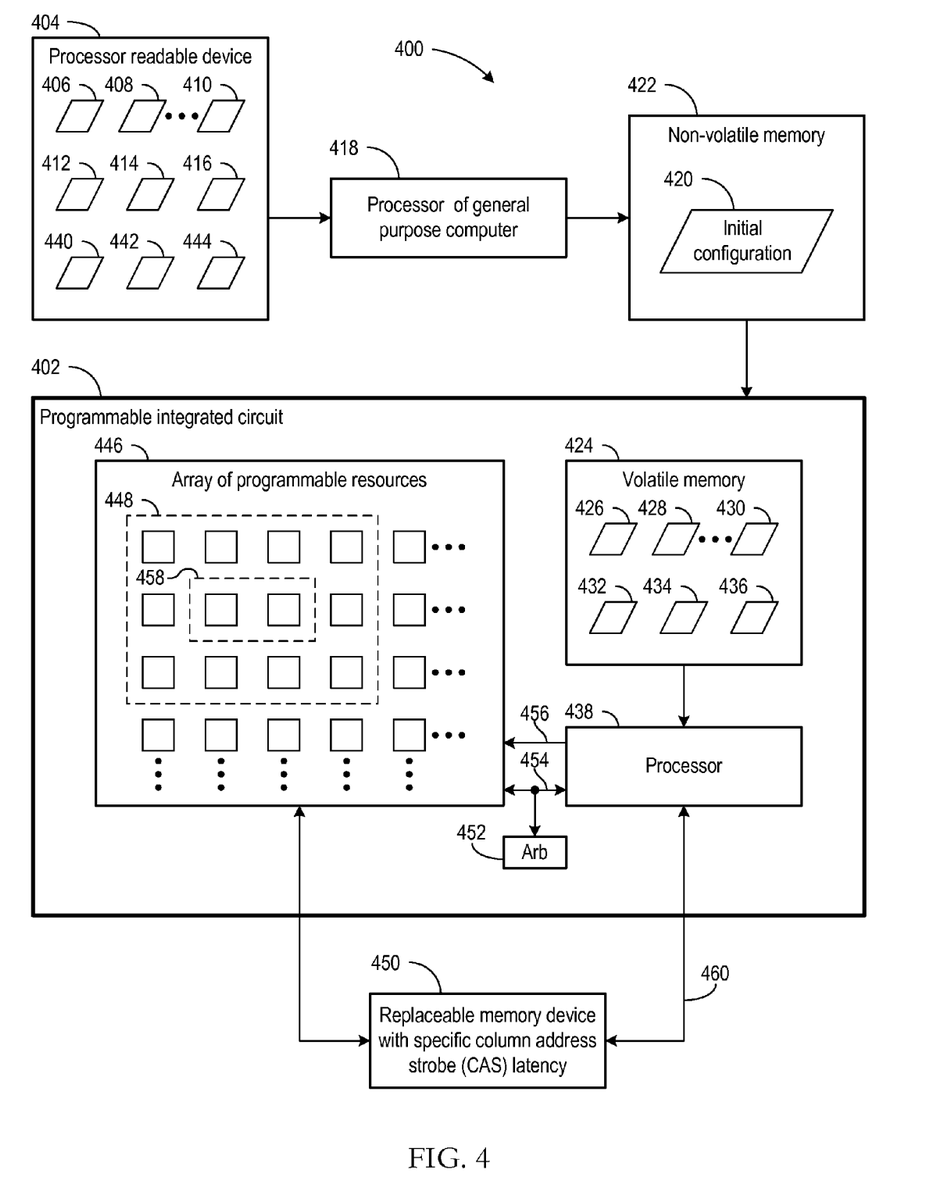
FIG. 4 is a block diagram of a memory arrangement including a memory controller implemented in accordance with an embodiment of the invention.

FIG. 4 is a block diagram of a system 400 including a memory controller implemented in accordance with various embodiments of the invention. The memory controller is implemented by configuring and reconfiguring a programmable integrated circuit 402.

A processor readable device 404 includes an HDL specification 406 of a general memory controller and HDL specifications 408 through 410 of specific memory controllers. Each of the HDL specifications 408 through 410 specifies a specific memory controller that is a modification of the general memory controller of HDL specification 406.

The processor readable device 404 also includes software modules 412, 414, and 416. Processor 418 of a general-purpose computer executes the instructions in software modules 412, 414, and 416. Upon executing the instructions in software module 412, processor 418 generates a reference configuration data-set from the HDL specification 406 of the general memory controller. Upon executing the instruction in software module 414, processor 418 generates special configuration data-sets from the HDL specifications 408 through 410 of the specific memory controller. Upon executing the instructions in software module 416, processor 418 generates a partial configuration data-set for each special configuration data-set. Processor 418 completes the execution of software modules 412, 414, and 416 by creating an initial configuration 420 stored in non-volatile memory 422.

In one embodiment, the initial configuration 420 contains data to initialize a volatile block memory 424 within the programmable integrated circuit 402. The initial configuration 420 initializes the block memory 424 with reference configuration data 426, which is a copy of the reference configuration data 412 from the processor readable device 404. The initial configuration 420 also initializes the block memory 424 with the partial configuration data-sets 428 through 430. Finally, the initial configuration 420 initializes the block memory 424 with software modules 432, 434, and 436 for processor 438 of the programmable integrated circuit 402. The software modules 432, 434, and 436 are copies of modules 440, 442, and 444 from the processor readable device 404.

In this embodiment, the initial configuration 420 initializes the block memory 424 on power-up or reset of the programmable integrated circuit 402. After the block memory 424 is initialized, processor 438 begins executing the instructions in initialization module 432. Executing the instructions in initialization module 432 causes processor 438 to initialize an array 446 of programmable resources, and processor 438 initializes the array 446 with reference configuration data 426 for implementing a general memory controller in a portion 448 of the array.

In another embodiment, the initial configuration 420 initializes both the volatile block memory 424 and the array 446 on power-up or reset of the programmable integrated circuit 402. The initial configuration 420 includes a copy of the reference configuration 412. On power-up or reset of the programmable integrated circuit 402, the initial configuration 420 initializes the array 446 to implement the general memory controller in a portion 448 of the array 446. The initial configuration 420 also initializes the block memory 424, but the reference configuration data 426 can be omitted in this embodiment.

After the array 446 and block memory 424 are initialized following power-up or reset, processor 438 begins or continues executing the instructions in initialization module 432. The instructions in initialization module 432 cause processor 438 to obtain a characteristic of an attached memory device 450. An example characteristic is a latency of a column address strobe (CAS) of the attached memory device 450, and processor 438 accesses this characteristic via a serial presence detect bus on line 460. Another example characteristic is the arbitration protocol of an arbitration block 452 of a data port on line 454 for storing and retrieving data stored in the memory device 450. Read and write data is transferred from agents, such as processor 438, to the memory device 450 via the data port on line 454 and the implemented memory controller.

Next, the processor 438 executes the instructions in the selection module 434. The selection module 434 causes the processor 438 to select one of the partial configuration data-sets 428 through 430. The processor 438 selects the partial configuration data-set that matches the characteristic of the attached memory device 450. For example, when memory device 450 is found to have a particular CAS latency, the processor 438 selects the partial configuration data-set appropriate for implementing a special memory controller providing that particular CAS latency.

Finally, the processor executes the instructions in the reconfiguration module 436. The reconfiguration module 436 causes processor 438 to use reconfiguration port 456 to reconfigure a portion 458 of the array 446 of programmable interconnect and logic resources. In the embodiment shown, the reconfigured portion 458 is a subset of the portion 448 for implementing the general memory controller. In another embodiment, some or all of the reconfigured portion is resources in the array 446 outside the portion 448 used for implementing the general memory controller.

After the portion 458 of the array 446 is reconfigured, the portion 448 implements the specific memory controller matching the characteristics of the system 400. In one embodiment, the memory device 450 can be replaced with another memory device having a different CAS latency, and on power-up the system 400 automatically determines the changed CAS latency, and configures and reconfigures the programmable logic device 402 to implement a specific memory controller for that CAS latency. Thus, the system 400 accommodates a variety of possible characteristics. However, the initial configuration 420 does not need to store the configuration data for all the possible specific memory controllers. Instead, the initial configuration 420 stores configuration data for one default or general memory controller, and partial configuration data for each specific memory controller.

In addition, because each specific memory controller is implemented without being programmable to handle a variety of possible operating characteristics, the logic and interconnect are simplified for each specific memory controller. This simplified logic and interconnect permits implementing each specific memory controller in fewer interconnect and logic resources in the array 446, and reduces the possibility of timing issues impacting the performance of the specific memory controller.

In another embodiment, the initialization module 432 causes processor 438 to monitor operating performance, such as the performance of the memory device 450. During operation, the processor 438 can determine that a different arbitration block 452 will improve overall system performance. In one example, the arbitration block 452 determines the relative priority of agents on the data port on line 454, and system performance is improved by changing the priorities of the agents. Thus, the bus priority of the processor 438 or another agent can be adjusted during system operation to improve system performance. In this embodiment, reconfiguration can freely switch between specific memory controllers if the portion 458 reconfigured is the same portion of the array 446 for all the partial reconfiguration data-sets.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or storage devices such as magnetic or optical disks or tapes, or electronic storage devices. Furthermore, the processes may be downloaded as an application over a network.

The present invention is thought to be applicable to a variety of circuits for controlling a memory arrangement and processes for implementing these circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for controlling a memory arrangement, comprising:
   an array of programmable resources and interconnect resources, the programmable resources and interconnect resources in the array initially configured with a reference configuration data-set, wherein the reference configuration data-set configures the programmable resources and interconnect resources to implement a general memory controller;
   a port coupled to the array, the port for reconfiguring the programmable resources and interconnect resources in the array; and
   a processor coupled to the port, the processor configured to obtain a characteristic of the memory arrangement and to select one of a plurality of partial reconfiguration data-sets in response to the characteristic of the memory arrangement, the processor further configured to partially reconfigure the programmable resources and interconnect resources in the array via the port with the selected partial reconfiguration data-set, wherein the selected partial reconfiguration data-set partially reconfigures the programmable resources and interconnect resources to implement a portion of a specific memory controller that differs from the general memory controller.

2. The system of claim 1, wherein the programmable resources and interconnect resources in the array implement the specific memory controller after being initially configured and subsequently partially reconfigured with the reference configuration data-set and the selected partial reconfiguration data-set, respectively.

3. The system of claim 1, wherein the processor is configured to initially configure and subsequently partially reconfigure the programmable resources and interconnect resources in the array via the port, the processor configured to initially configure the programmable resources and interconnect resources with the reference configuration data-set and to subsequently partially reconfigure the programmable resources and interconnect resources with the selected partial reconfiguration data-set.

4. The system of claim 3, wherein the programmable resources and interconnect resources in the array implement the specific memory controller following the processor configuring and partially reconfiguring the programmable resources and interconnect resources with the reference configuration and the plurality of partial reconfiguration data-sets.

5. The system of claim 1, wherein the characteristic of the memory arrangement is a latency of a column address strobe of at least one memory device in the memory arrangement.

6. The system of claim 1, wherein the characteristic of the memory arrangement is a selected arbitration protocol for at least one data port, the at least one data port for storing data values in the memory arrangement and for retrieving the data values from the memory arrangement.

7. The system of claim 1, further comprising a non-volatile memory coupled to the array of programmable resources and interconnect resources, the reference configuration data-set stored in the non-volatile memory, the programmable resources and interconnect resources initially configured to implement the general memory controller using the reference configuration data-set from the non-volatile memory.

8. The system of claim 7, further comprising a volatile memory coupled to the processor and the non-volatile memory, the volatile memory initially configured with a plurality of instructions and the partial reconfiguration data-sets, the volatile memory initially configured using the reference configuration data-set from the non-volatile memory, wherein in response to the processor executing the plurality of instructions from the volatile memory, the processor obtains the characteristic of the memory arrangement, selects the specific one of the plurality of partial reconfiguration data-sets in response to the characteristic, and reconfigures the programmable resources and interconnect resources with the specific one of the plurality of partial reconfiguration data-sets from the volatile memory.

9. The system of claim 8, wherein a programmable integrated circuit includes the array of programmable resources and interconnect resources, the port, the processor, and the non-volatile memory.

10. The system of claim 1, wherein a programmable integrated circuit includes the array of programmable resources and interconnect resources, the port, and the processor.

11. A process for implementing a memory controller of a memory arrangement, comprising:
generating a reference configuration data-set, wherein a programmable integrated circuit includes an array of programmable resources and interconnect resources, and the reference configuration data-set configures the array to implement a general memory controller;
generating a plurality of special configuration data-sets for a plurality of specific memory controllers, wherein each special configuration data-set configures the array to implement a respective one of the specific memory controllers, and the special configuration data-set matches the reference configuration data-set for a first portion of the array and the special configuration data-set does not match the reference configuration data-set for a second portion of the array;
generating a plurality of respective partial reconfiguration data-sets for the plurality of special configuration data-sets, wherein the respective partial reconfiguration data-set for each special configuration data-set reconfigures the second portion of the array in accordance with the special configuration data-set, and the respective partial reconfiguration data-set does not reconfigure the first portion of the array;
configuring the array of the programmable integrated circuit with the reference configuration data-set;
selecting one of the specific memory controllers in response to a characteristic of the memory arrangement; and
reconfiguring the second portion of the array with the respective partial reconfiguration data-set for the special configuration data-set for the one of the specific memory controllers.

12. The process of claim 11, wherein the generating of the reference configuration data-set includes compiling the reference configuration data-set from a hardware description language (HDL) specification of the general memory controller, and the generating of each of the plurality of special configuration data-sets includes producing a modification of the HDL specification that specifies the specific memory controller for the special configuration data-set, and incrementally compiling the special configuration data-set from the modification of the HDL specification.

13. The process of claim 12, wherein the generating of the respective partial reconfiguration data-set for each special configuration data-set includes extracting a respective difference between the special configuration data-set and the reference configuration data-set.

14. The process of claim 13, wherein the respective difference of each of the plurality of special configuration data-sets defines the second portion of the array for the special configuration data-set.

15. The process of claim 11, further comprising obtaining the characteristic of the memory arrangement from at least one memory device in the memory arrangement.

16. The process of claim 15, wherein the characteristic of the memory arrangement is a latency of a column address strobe of the at least one memory device in the memory arrangement.

17. The process of claim 11, wherein the characteristic of the memory arrangement is a selected arbitration protocol for at least one data port, the at least one data port for storing data values in the memory arrangement and for retrieving the data values from the memory arrangement.

18. The process of claim 11, wherein the reconfiguring the second portion of the array with the respective partial reconfiguration data-set includes reconfiguring the second portion of the array without reconfiguring the first portion of the array.

19. The process of claim 11, wherein the first and second portions of the array implement the specific memory controller following the reconfiguring after the configuring.

20. A program storage medium, comprising:
a processor-readable device configured with instructions for controlling a memory arrangement, wherein execution of the instructions by one or more processors causes the one or more processors to perform operations, the operations including:

generating a reference configuration data-set, wherein a programmable integrated circuit includes an array of programmable resources and interconnect resources, and the array is initially configured to implement a general memory controller using the reference configuration data-set;

generating a plurality of special configuration data-sets for a plurality of specific memory controllers, wherein each special configuration data-set configures a first and second portion of the array to implement a respective one of the specific memory controllers, and the special configuration data-set matches the reference configuration data-set for the first portion of the array;

generating a plurality of respective partial reconfiguration data-sets for the plurality of special configuration data-sets, wherein the respective partial reconfiguration data-set for each special configuration data-set reconfigures the second portion of the array in accordance with the special configuration data-set, and the respective partial reconfiguration data-set does not reconfigure the first portion of the array;

selecting one of the specific memory controllers in response to a characteristic of the memory arrangement; and reconfiguring the second portion of the array with the respective partial reconfiguration data-set for the special configuration data-set for the one of the specific memory controllers.

\* \* \* \* \*